(12) United States Patent
Tazuke

(10) Patent No.: US 6,650,312 B2
(45) Date of Patent: Nov. 18, 2003

(54) LIQUID CRYSTAL DISPLAY MODULE CAPABLE OF AVOIDING GENERATION OF RIB-LIKE PATTERNS

(75) Inventor: Toshikazu Tazuke, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 296 days.

(21) Appl. No.: 09/894,361

(22) Filed: Jun. 28, 2001

(65) Prior Publication Data

US 2002/0008687 A1 Jan. 24, 2002

(30) Foreign Application Priority Data

Jun. 29, 2000 (JP) ......... 2000-195540

(51) Int. Cl.[7] .................. G09G 3/36
(52) U.S. Cl. ............ 345/96; 345/87
(58) Field of Search ............ 345/87, 88, 90, 345/92, 95, 96, 98, 99, 100, 211, 212, 213, 89

(56) References Cited

U.S. PATENT DOCUMENTS 5,986,724 A * 11/1999 Akiyama et al. ........... 349/41
6,376,995 B1 * 4/2002 Kato et al. ........... 315/169.3
6,528,952 B2 * 3/2003 Kato et al. ........... 315/169.4
6,538,708 B2 * 3/2003 Zhang .................. 349/40
6,552,710 B1 * 4/2003 Shimizu et al. ......... 345/100

* cited by examiner

*Primary Examiner*—Richard Hjerpe
*Assistant Examiner*—Ronald Laneau
(74) *Attorney, Agent, or Firm*—Choate, Hall & Stewart

(57) ABSTRACT

In an apparatus for driving data lines of a liquid crystal display panel, a plurality of voltage followers are provided, and a plurality of output pads are connected to the data lines. A plurality of first switches are connected between the voltage followers and the output pads, and a plurality of second switches are connected between the output pads. First and second charge neutralization pads are connected to a most-upstream one and a most-downstream one of the output pads. A third switch is connected between one, respectively, of the first and second charge neutralization pads and the most-upstream or most-downstream one of the output pads.

11 Claims, 13 Drawing Sheets

*Fig. 3A*  PRIOR ART

POL="0"

| + | − | + | − | + |
|---|---|---|---|---|
| − | + | − | + | − |
| + | − | + | − | + |
| − | + | − | + | − |
| + | − | + | − | + |

*Fig. 3B*  PRIOR ART

POL="1"

| − | + | − | + | − |
|---|---|---|---|---|
| + | − | + | − | + |
| − | + | − | + | − |
| + | − | + | − | + |
| − | + | − | + | − |

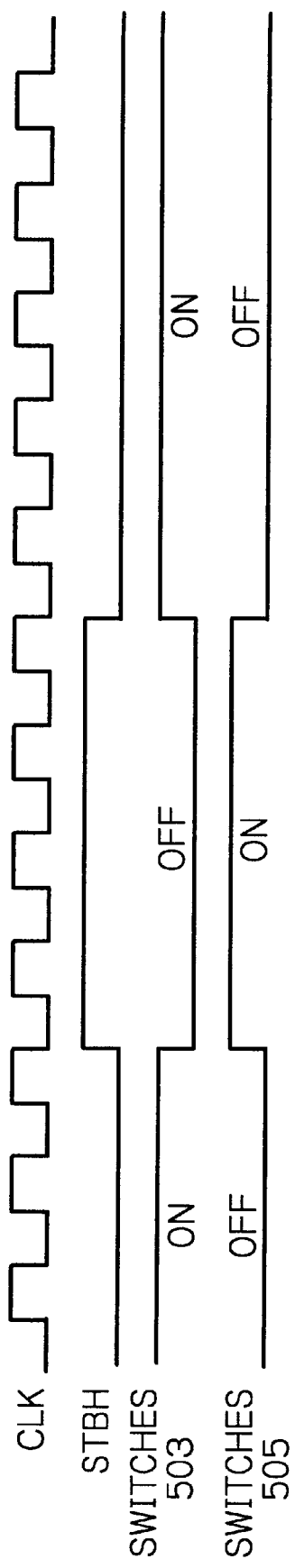

1

LIQUID CRYSTAL DISPLAY MODULE CAPABLE OF AVOIDING GENERATION OF RIB-LIKE PATTERNS

BACKGROUND OF THE INVENTION

1. Field of the Invention

The present invention relates to a liquid crystal display (LCD) module, and more particularly, to the improvement of data line drive apparatuses thereof.

2. Description of the Related Art

A prior art LCD module is constructed by an LCD panel having data lines, gate lines and liquid crystal cells each connected to one of the data lines and one of the gate lines, a plurality of data line drive apparatuses provided at an edge of the LCD panel and connected by a cascade connection to each other for driving the data lines, and a plurality of gate line drive apparatuses provided at another edge of the LCD panel and connected by a cascade connection to each other. In this case, in view of power consumption, use is made of a dot inversion method rather than a frame inversion method.

Also, each of the data line drive apparatuses is formed by a plurality of voltage followers, a plurality of output pads each connected to one of the data lines, a plurality of first switches each connected between one of the voltage followers and one of the output pads, and a plurality of second switches each connected between two of the output pads.

The first and second switches are turned OFF and ON, respectively, by a first state of a strobe signal, and the first and second switches are turned ON, and OFF, respectively, by a second state of the strobe signal. Thus, the charges are neutralized among the data lines to salvage the charges, which further decreases the power consumption. This will be explained in detail later.

In the above-described prior art LCD module, however, since the neutralization of charges among the data lines is not carried out between the data line drive apparatuses, rib-like patterns are generated in the LCD panel in correspondence with the boundaries between the data line drive apparatuses.

SUMMARY OF THE INVENTION

It is an object of the present invention to provide an LCD module capable of avoiding the generation of rib-like patterns.

According to the present invention, in an LCD module including an LCD panel having data lines, gate lines and liquid crystal cells each connected to one of the data lines and one of the gate lines, and a plurality of data line drive apparatuses, provided at an edge of the LCD panel and connected by a cascade connection to each other, for driving the data lines, each of the data line drive apparatuses is formed by a plurality of voltage followers, a plurality of output pads each connected to one of the data lines, a plurality of first switches each connected between one of the voltage followers and one of the output pads, a plurality of second switches each connected between two of the output pads, first and second charge neutralization pads connected to a most-upstream one and a most-downstream one, respectively, of the output pads, and a third switch connected between one of the first and second charge neutralization pads and the most-upstream or most-downstream one of the output pads. The first, second and third switches are turned OFF, ON and ON, respectively, by a first state of a strobe signal, and the first, second and third switches are turned ON, OFF and OFF, respectively, by a second state of the strobe signal. The first charge neutralization pads of one of the data line drive apparatuses is electrically connected to the second charge neutralization pad of another of the data line drive apparatuses upstream of the one of the data line drive apparatuses, and the second charge neutralization pad of one of the data line drive apparatuses is electrically connected to the second charge neutralization pad of another of the data line drive apparatuses downstream of the one of the data line drive apparatuses.

Also, in an LCD module including an LCD panel having data lines, gate lines and liquid crystal cells each connected to one of the data lines and one of the gate lines, and a plurality of data line drive apparatuses, provided at an edge of the LCD panel and connected by a cascade connection to each other, for driving the data lines, each of the data line drive apparatuses is formed by a plurality of voltage followers, a plurality of output pads each connected to one of the data lines, a plurality of first switches each connected between one of the voltage followers and one of the output pads, first and second charge neutralization pads, a common line connected between the first and second neutralization pad, and a plurality of second switches each connected between the common line and one of the output pads. The first and second switches are turned OFF and ON, respectively, by a first state of a strobe signal, and the first and second switches are turned ON and OFF, respectively, by a second state of the strobe signal. The first charge neutralization pad of one of the data line drive apparatuses is electrically connected to the second charge neutralization pad of another of said data line drive apparatuses upstream of the one of the data line drive apparatuses, and the second charge neutralization pad of one of the data line drive apparatuses is electrically connected to the second charge neutralization pad of another of the data line drive apparatuses downstream of the one of the data line drive apparatuses.

BRIEF DESCRIPTION OF THE DRAWINGS

The present invention will be more clearly understood from the description set forth below, as compared with the prior art, with reference to the accompanying drawings, wherein:

FIGS. 3A and 3B are diagrams for explaining a dot inversion method by the polarity signal of FIG. 2;

FIG. 13 is a timing diagram for explaining the operation of the driver circuit of FIG. 12.

DESCRIPTION OF THE PREFERRED EMBODIMENT

Before the description of the preferred embodiment, a prior art active matrix type LCD module will be explained with reference to FIGS. 1 and 2.

Figure 1:
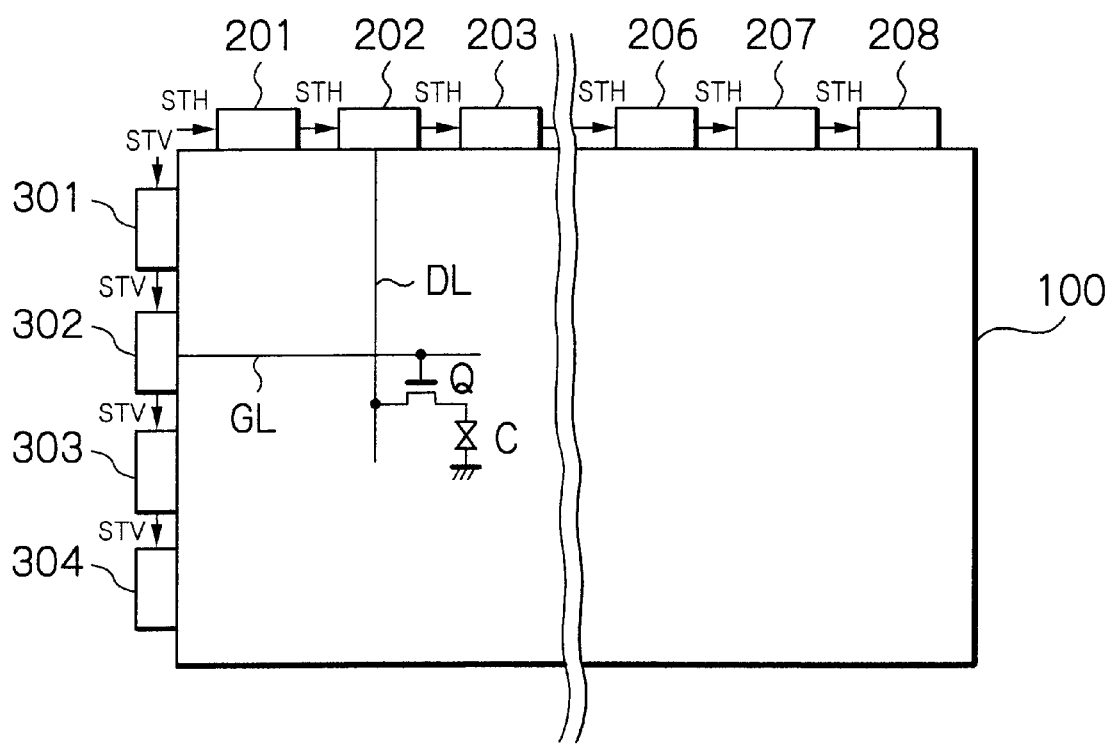
FIG. 1 is a plan view illustrating a prior art active matrix type LCD module.

In FIG. 1, reference numeral 100 designates an LCD panel having 1024×768 dots. In this case, each pixel is formed by three color elements, i.e., R(red), G(green) and B(blue), and therefore, the LCD panel 100 includes 3072 (1024×3) data lines (signal lines) DL and 768 gate lines (scan lines) GL. One pixel located at each intersection between the data lines DL and the gate lines GL is formed by one thin film transistor Q and one liquid crystal cell C.

In order to drive the 3072 data lines DL, eight data line drive apparatuses 201, 202, . . . , 208 each for driving 384 data lines are provided along a horizontal edge of the LCD panel 100. In this case, the data line drive apparatuses 201, 202, . . . , 208 are arranged by a cascade connection method to transmit a horizontal start pulse signal STH therethrough.

On the other hand, in order to drive the 768 gate lines GL, four data line drive apparatuses 301, 302, 303 and 304 each for driving 192 gate lines are provided along a vertical edge of the LCD panel 100. In this case, the gate line drive apparatuses 301, 302, 303 and 304 are arranged by a cascade connection method to transmit a vertical start pulse signal STV therethrough.

Note that the data line drive apparatuses 201, 202, . . . , 208 are mounted on a tape carrier package (TCP) and the gate line drive apparatuses 301, 302, 303 and 304 are mounted on another tape carrier package in advance. Then, the tape carrier packages are arranged on the edges of the LCD panel 100.

The present invention relates to the data line drive apparatuses 201, 202, . . . , 208.

The data line drive apparatus such as 202 of FIG. 1 is explained in detail next with reference to FIG. 2. Note that the data line drive apparatuses 201, 202, . . . , 208 have the same configuration.

Figure 2:
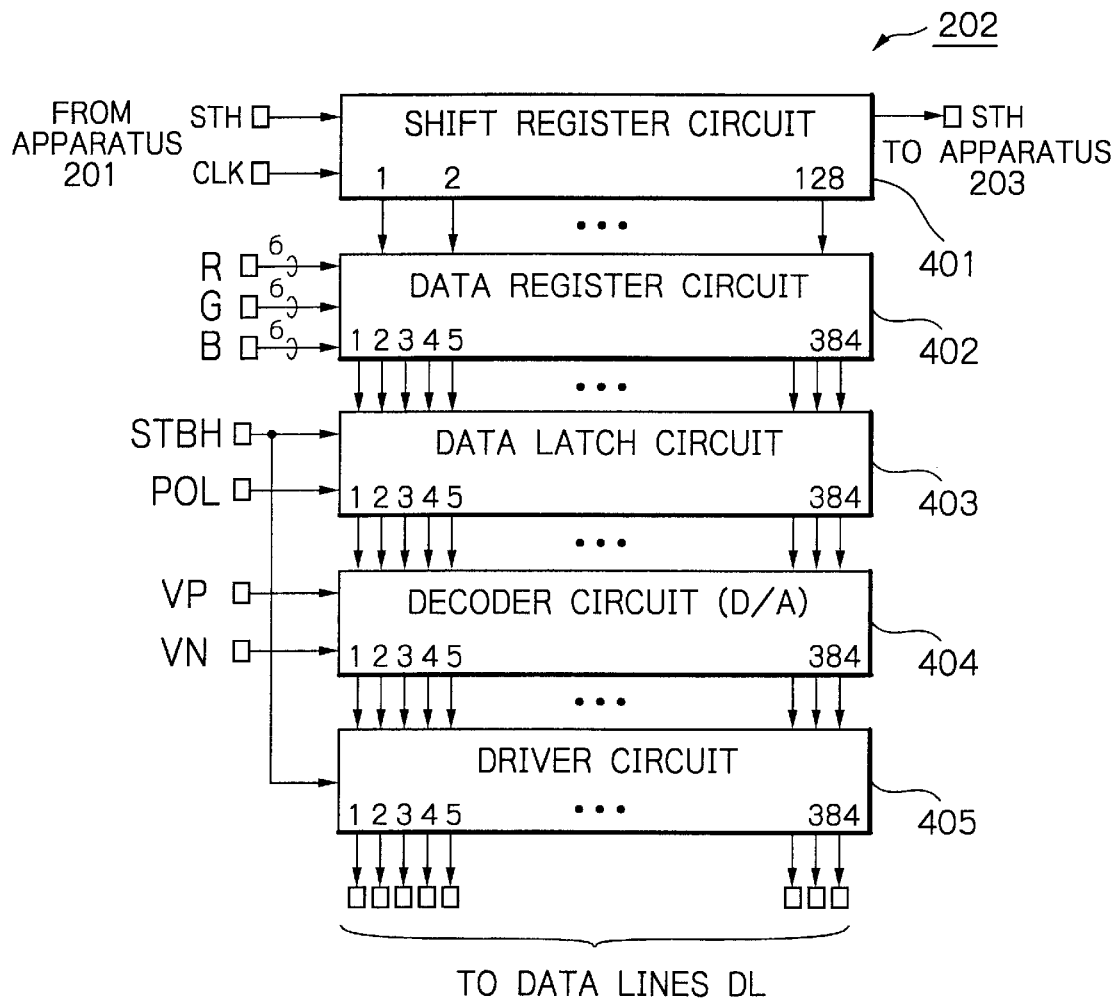
FIG. 2 is a detailed block circuit diagram of the data line drive apparatus of FIG. 1.

In FIG. 2, reference numeral 401 designates a shift register circuit for shifting a horizontal start pulse signal STH in synchronization with a shift clock signal CLK. The shift register circuit 401 has 128 serially-connected D-type flip-flops clocked by the shift clock signal CLK to generate 128 output signals sequentially. Note that the horizontal start pulse signal STH is generated from a timing generating circuit (not shown) which receives a horizontal synchronization signal HSYNC. Note that such a timing generating circuit is provided commonly for all the data line drive apparatuses 201, 202, . . . 208.

A data register circuit 402 is formed by 384 D-type flip-flops for receiving 6-bit color video signals R, G and B and are triggered by the 128 output signals of the shift register circuit 401. For example, the 1st, 2nd, and 3rd D-type flip-flops for receiving the color video signals R, G and B, respectively, are triggered by the 1st output signal of the shift register circuit 401. Similarly, the 4th, 5th, and 6th D-type flip-flops for receiving the color video signals R, G and B, respectively, are triggered by the 2nd output signal of the shift register circuit 401.

Figures 3A, 3B:
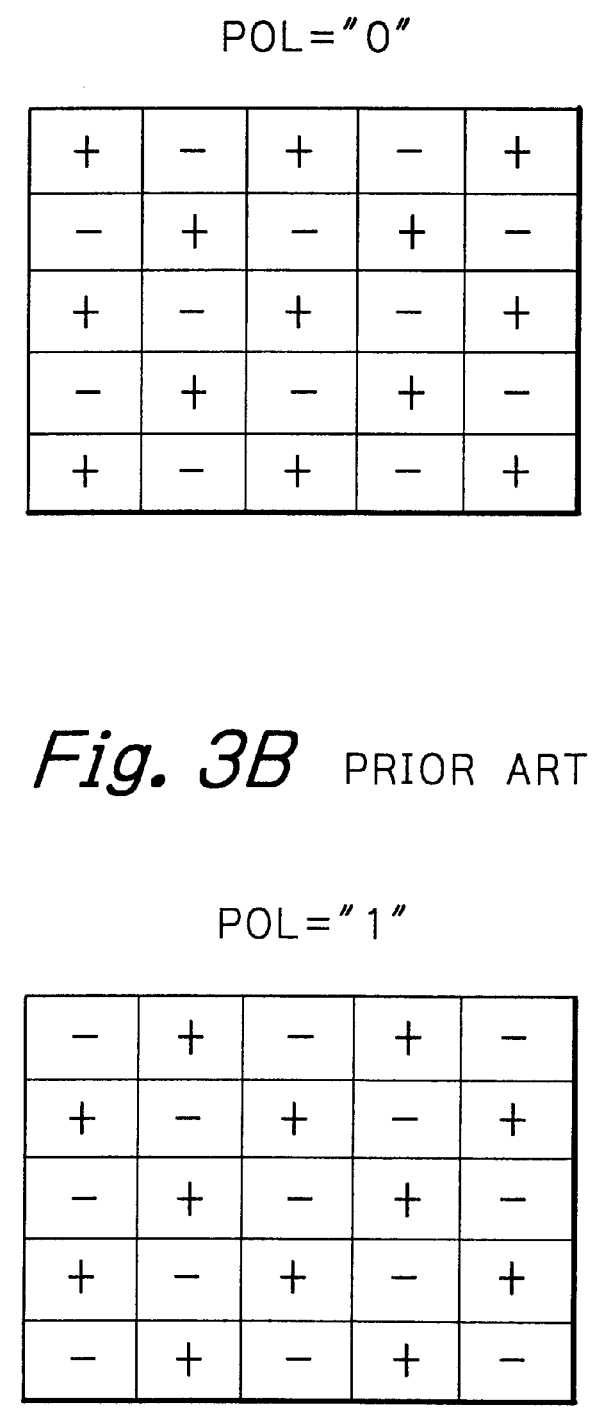

A data latch circuit 403 is formed by 384 registers for receiving output signals of the data register circuit 402 in synchronization with a horizontal strobe signal STBH which is generated from the timing generating circuit. Also, the data latch circuit 403 receives a polarity signal POL which is also generated from the timing generating circuit. This polarity signal POL is used for carrying out a dot inversion method which is advantageous in power consumption. That is, if POL="0", the 1st output signal, the 3rd output signal, the 5th output signal, . . . of the data latch circuit 403 are made positive and the other signals are made negative as shown in FIG. 3A. On the other hand, if POL="1", the 2nd output signal, the 4th output signal, the 6th output signal, . . . of the data latch circuit 403 are made positive and the other signals are made negative as shown in FIG. 3B.

A decoder circuit 404 is formed by 384 digital/analog (D/A) converters powered by a positive power supply voltage VP and a negative power supply voltage VN. In this case, the decoder circuit 404 generates positive 64 gradation voltages by the positive power supply voltage VP and negative 64 gradation voltages by the negative power supply voltage VN therein. As a result, each of the 384 D/A converters converts one of the 384 output signals of the data latch circuit 403 into a positive or negative analog voltage.

A driver circuit 405 is driven by the horizontal strobe signal STBH to apply the 384 output signals of the decoder circuit 404 to the data lines DL of the LCD panel 100 of FIG. 1.

The driver circuit 405 of FIG. 2 is explained next in detail with reference to FIG. 4.

Figure 4:
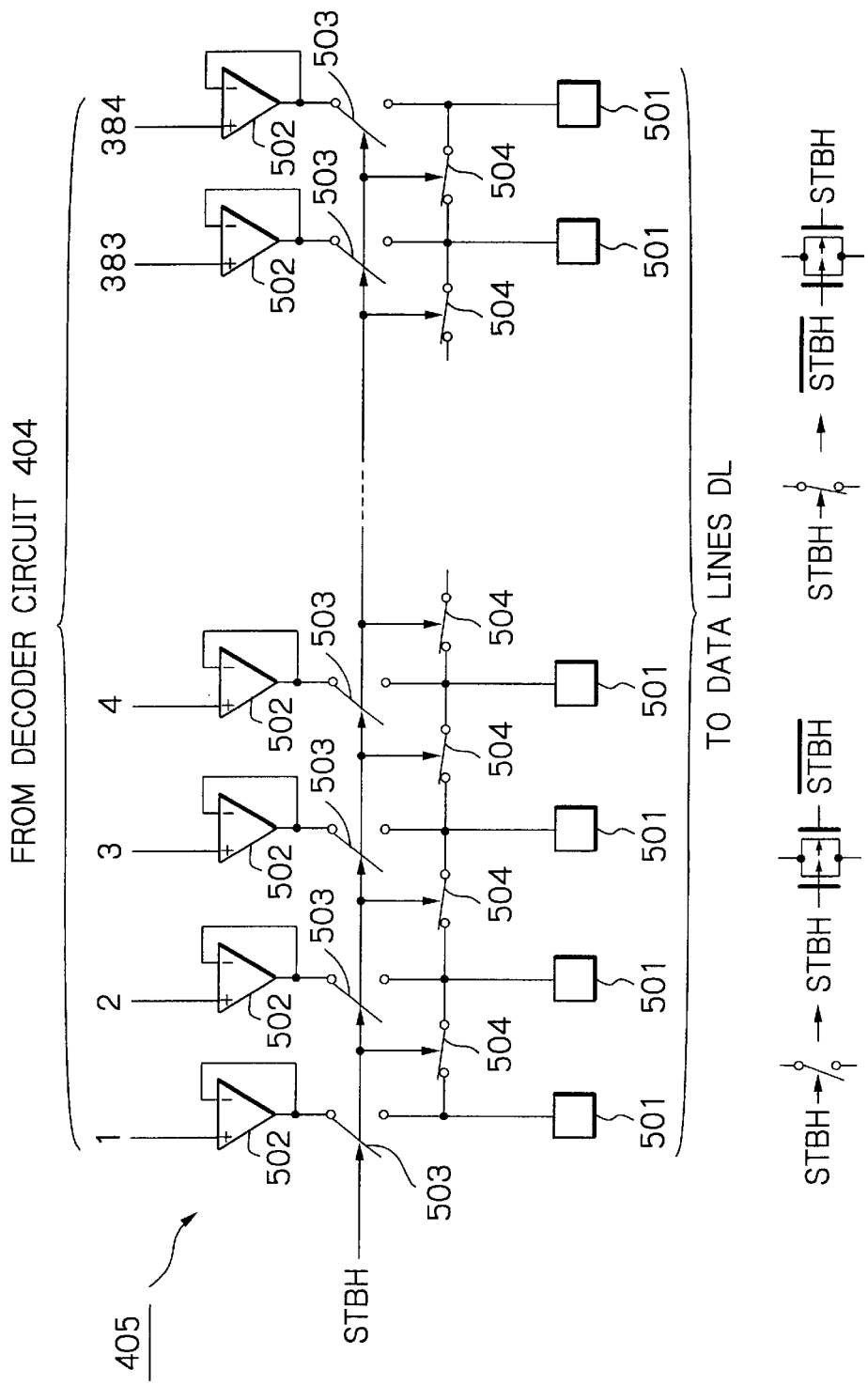
FIG. 4 is a detailed circuit diagram of the driver circuit of FIG. 2.

In FIG. 4, 384 output pads 501 are provided and will be connected to the data lines DL of the LCD panel 100 of FIG. 1. Also, 384 operational amplifiers 502 serving as voltage followers are provided to receive the 384 output signals of the decoder circuit 404. Further, 384 switches 503 formed by transfer gates are provided between the operational amplifiers 502 and output pads 501, and 383 switches 504 formed by transfer gates are provided between the output pads 501. The switches 503 and 504 are controlled by the horizontal strobe signal STBH.

Figure 5:
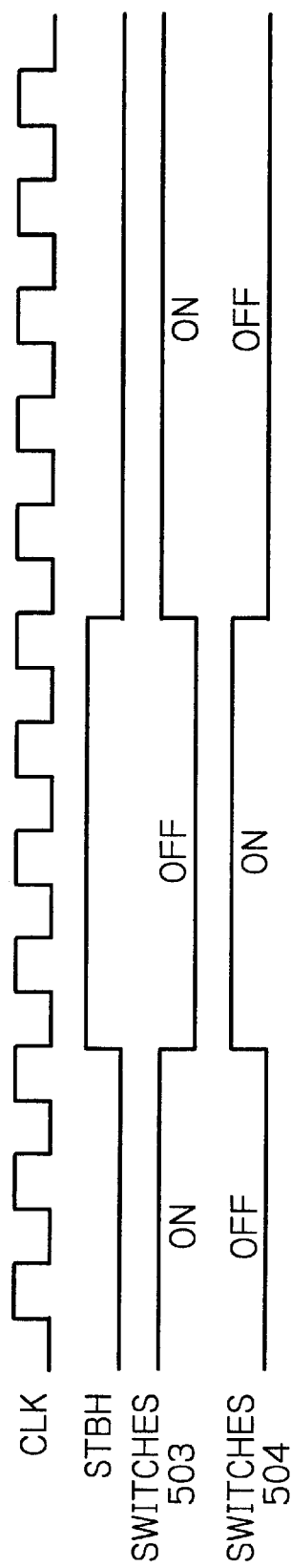
FIG. 5 is a timing diagram for explaining the operation of the driver circuit of FIG. 4.

The operation of the driver circuit 405 of FIG. 4 is explained next with reference to FIG. 5.

First, the horizontal strobe signal STBH is made high, so that the switches 503 and 504 are turned OFF and ON, respectively. As a result, the operational amplifiers 502 are electrically isolated from the output pads 501 by the turned-OFF switches 503, and all the output pads 501 are electrically connected by the turned-ON switches 504 to each other. Thus, the charges are neutralized among the data lines DL, which further decreases the power consumption. Then, the horizontal strobe signal STBH is made low, so that the switches 503 and 504 are turned ON and OFF, respectively. As a result, the operational amplifiers 502 are electrically connected to the output pads 501 by the turned-ON switches 503, and the output pads 501 are electrically isolated by the turned-OFF switches 504. Thus, the output signals of the operational amplifiers 502 are supplied to the data lines DL.

In the LCD module using the data line drive apparatuses 201 to 208 of FIG. 1 each including the driver circuit 405 of FIG. 2, however, since the neutralization of charges among the data lines DL is not carried out between the data line drive apparatuses 201 to 208, seven rib-like patterns are generated in the LCD panel 100 in correspondence with the boundaries between the data line drive apparatuses 201 to 208.

Figure 6:
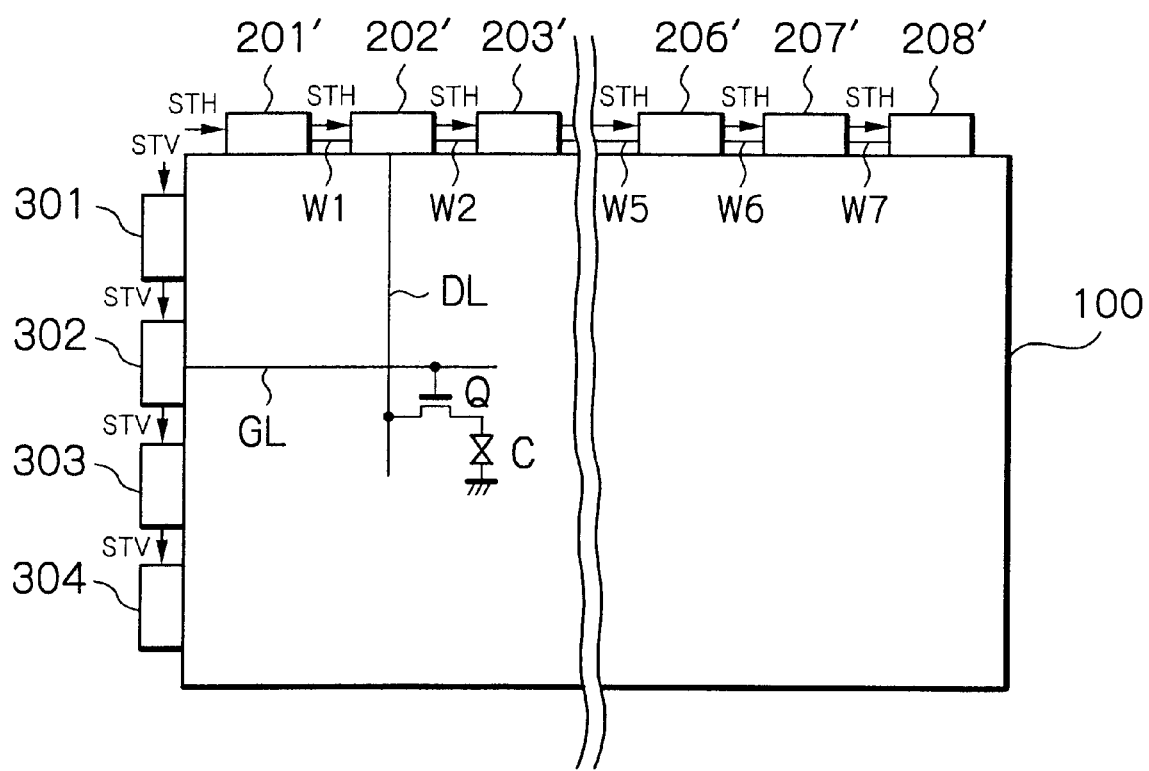
FIG. 6 is a plan view illustrating an embodiment of the LCD module according to the present invention.

In FIG. 6, which illustrates an embodiment of the present invention, data line drive apparatuses 201', 202' . . . , 208' are provided along the LCD panel 100 in the same way as the data line drive apparatuses 201, 202, ..., 208 of FIG. 1. Additionally, bonding wires W1, W2, ..., W7 are connected between the data line drive apparatuses 201', 202', ..., 208', to carry out a charge neutralization between the data line drive apparatuses 201', 202', ..., 208'.

Figure 7:
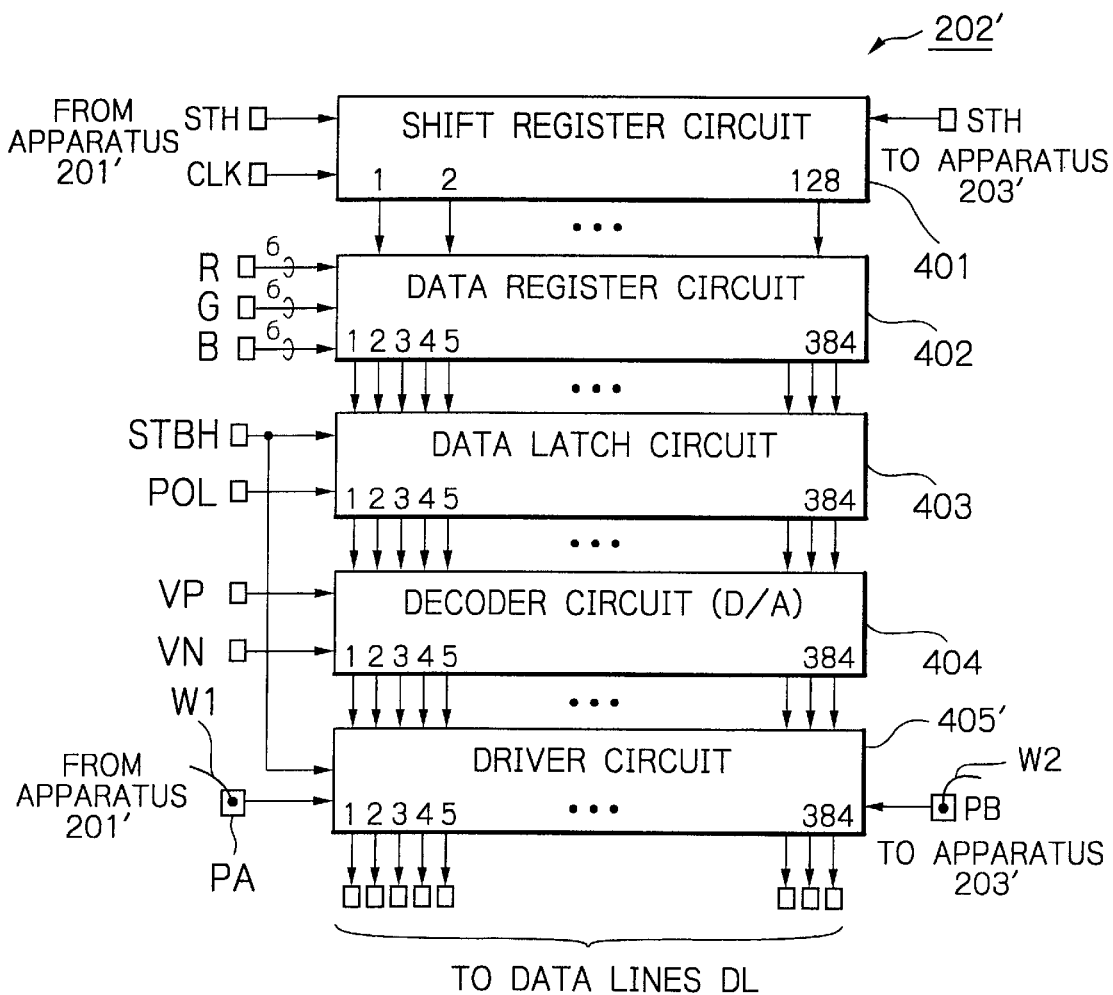
FIG. 7 is a detailed block circuit diagram of the data line drive apparatus of FIG. 6.

In FIG. 7, which is a detailed block circuit diagram of the data line drive apparatus such as 202' of FIG. 6, the driver circuit 405 of FIG. 2 is modified into a driver circuit 405' which further has a charge neutralization pad PA connected by a bonding wire such as W1 to a driver circuit of an upstream data line drive apparatus such as 201' and a charge neutralization pad PB connected by a bonding wire such as W2 to a driver circuit of a downstream data line drive apparatus such as 203'.

Figure 8:
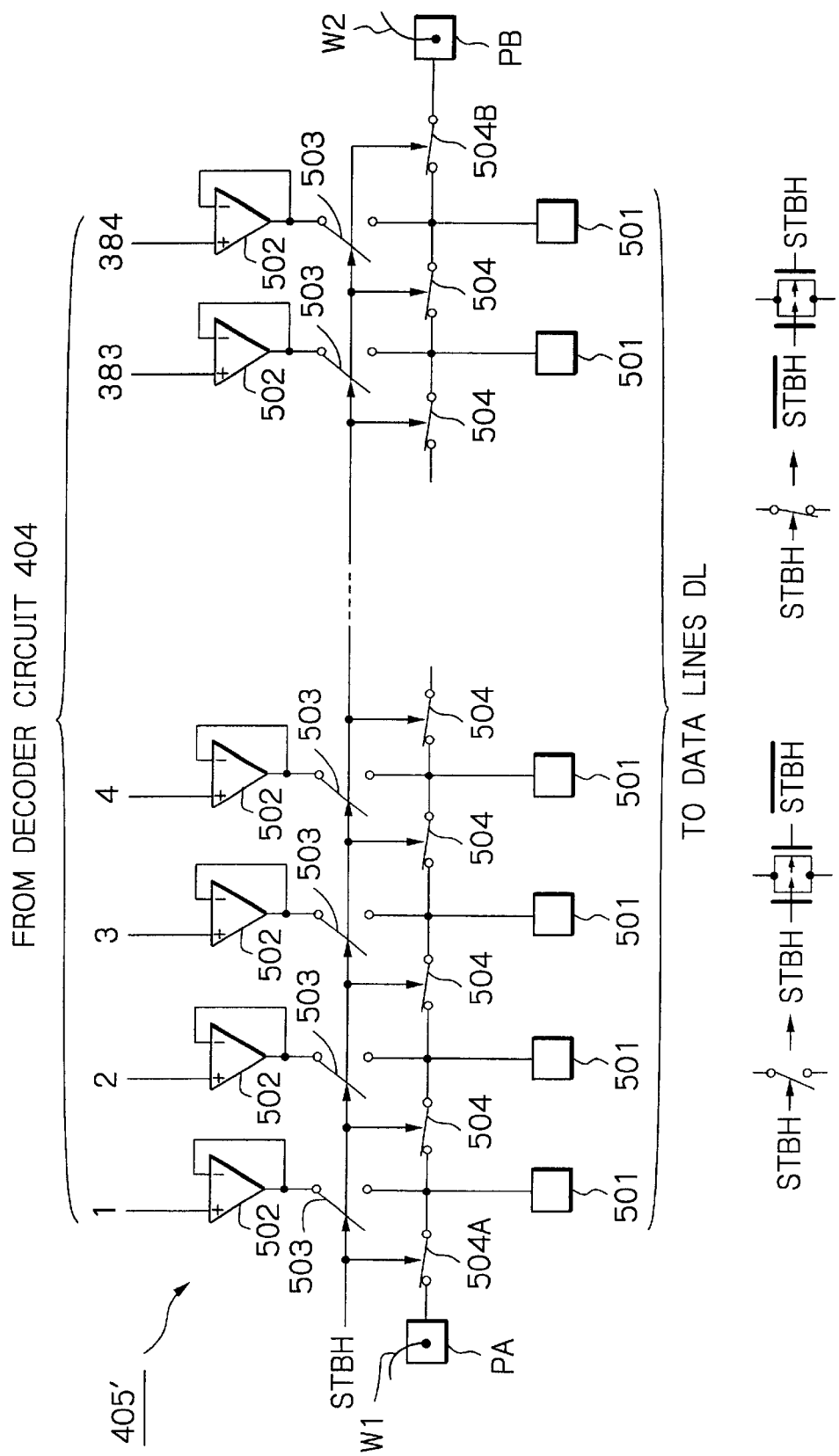
FIG. 8 is a detailed circuit diagram of a first example of the driver circuit of FIG. 7.

In FIG. 8, which is a detailed circuit diagram of a first example of the driver circuit 405' of FIG. 7, switches 504A and 504B having the same configuration as the switches 504 are added to the elements of the driver circuit 405 of FIG. 4. In more detail, the switch 504A is connected between the charge neutralization pad PA and the most-upstream one of the switches 504, and the switch 504B is connected between the charge neutralization pad PB and the most downstream one of the switches 504. The switches 504A and 504B are controlled by the horizontal strobe signal STBH in the same way as the switches 504.

Figure 9:
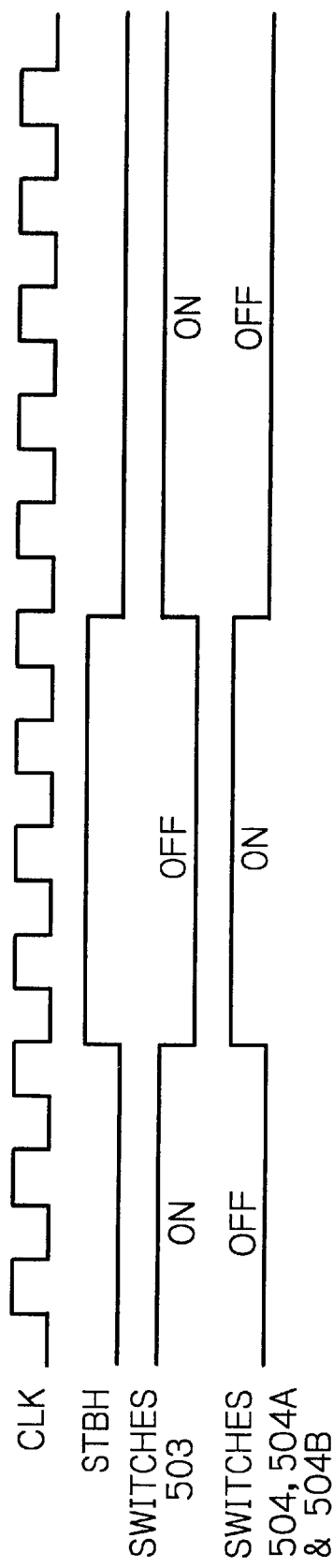
FIG. 9 is a timing diagram for explaining the operation of the driver circuit of FIG. 8.

The operation of the driver circuit 405' of FIG. 8 is explained next with reference to FIG. 9.

First, the horizontal strobe signal STBH is made high, the switches 503 are turned OFF and the switches 504A and 504B as well as the switches 504 are turned ON. As a result, the operational amplifiers 502 are electrically isolated from the output pads 501 by the turned-OFF switches 503. Also, all the output pads 501 are electrically connected by the turned-ON switches 504 to each other. Additionally, the output pads of all the data line drive apparatuses 201' to 208' are electrically connected by the turned-ON switches 504A and 504B. Thus, the charges are neutralized among the data lines DL of all the data line drive apparatuses 201' to 208'. Then, the horizontal strobe signal STBH is made low, the switches 503 are turned ON and the switches 504, 504A and 504B are turned OFF. As a result, the operational amplifiers 502 are electrically connected to the output pads 501 by the turned-ON switches 503, and the output pads 501 are electrically isolated by the turned-OFF switches 504, 504A and 504B. Thus, the output signals of the operational amplifiers 502 are supplied to the data lines DL.

In the LCD module using the data line drive apparatuses 201' to 208' of FIG. 6 each including the driver circuit 405' of FIG. 8, since the neutralization of charges among the data lines DL is carried out between the data line drive apparatuses 201' to 208', no rib-like patterns are generated in the LCD panel 100.

Figure 10:
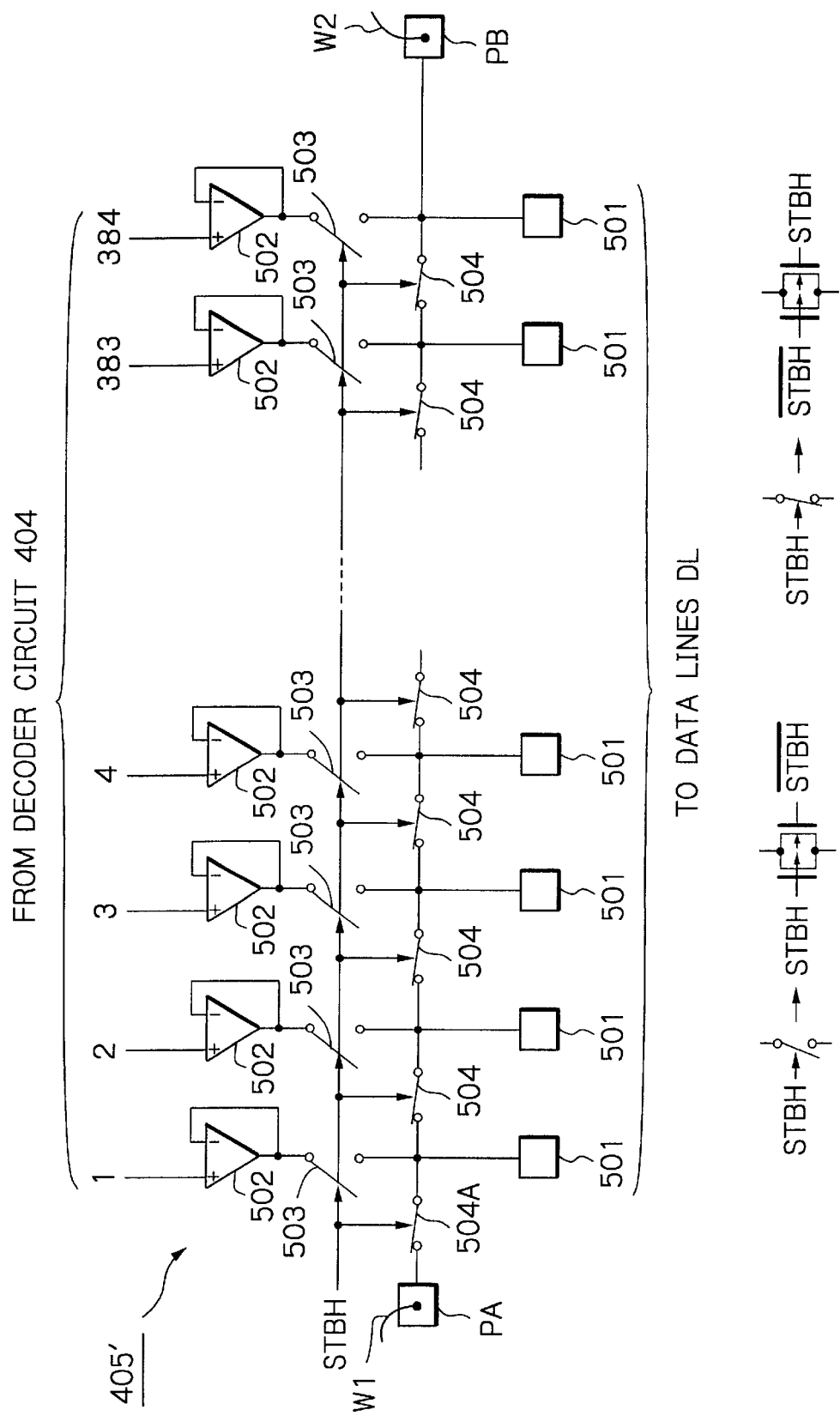
FIG. 10 is a detailed circuit diagram of a second example of the driver circuit of FIG. 7.

In FIG. 10, which is a detailed circuit diagram of a second example of the driver circuit 405' of FIG. 7, the switch 504B of FIG. 8 is not provided, and therefore, the most downstream output pad 501 is connected directly to the charge neutralization pad PB. In this case, when the switch 504A of the downstream data line drive apparatus such as 203' is turned ON by the horizontal strobe signal STBH, the output pads 501 of the data line drive apparatus 202' are electrically connected to the output pads of the data line drive apparatus 203'. Thus, the driver circuit 405' of FIG. 10 operates in the same way as the driver circuit 405' of FIG. 8.

Figure 11:
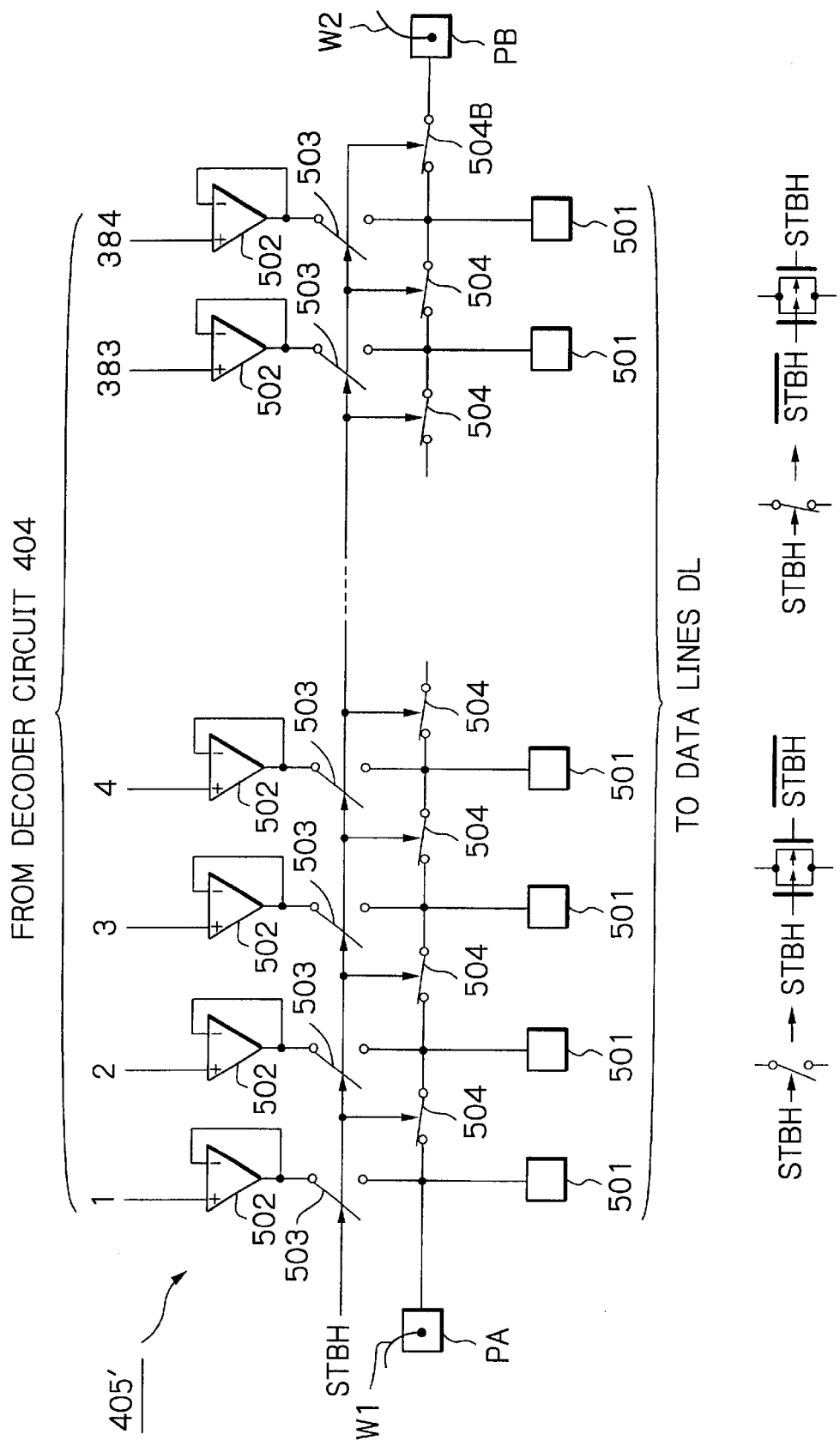
FIG. 11 is a detailed circuit diagram of a third example of the driver circuit of FIG. 7.

In FIG. 11, which is a detailed circuit diagram of a third example of the driver circuit 405' of FIG. 7, the switch 504A of FIG. 8 is not provided, and therefore, the most upstream output pad 501 is connected directly to the charge neutralization pad PA. In this case, when the switch 509B of the upstream data line drive apparatus such as 201' is turned ON by the horizontal strobe signal STBH, the output pads 501 of the data line drive apparatus 202' are electrically connected to the output pads of the data line drive apparatus 201'. Thus, the driver circuit 405' of FIG. 11 operates in the same way as the driver circuit 405' of FIG. 8.

Figure 12:
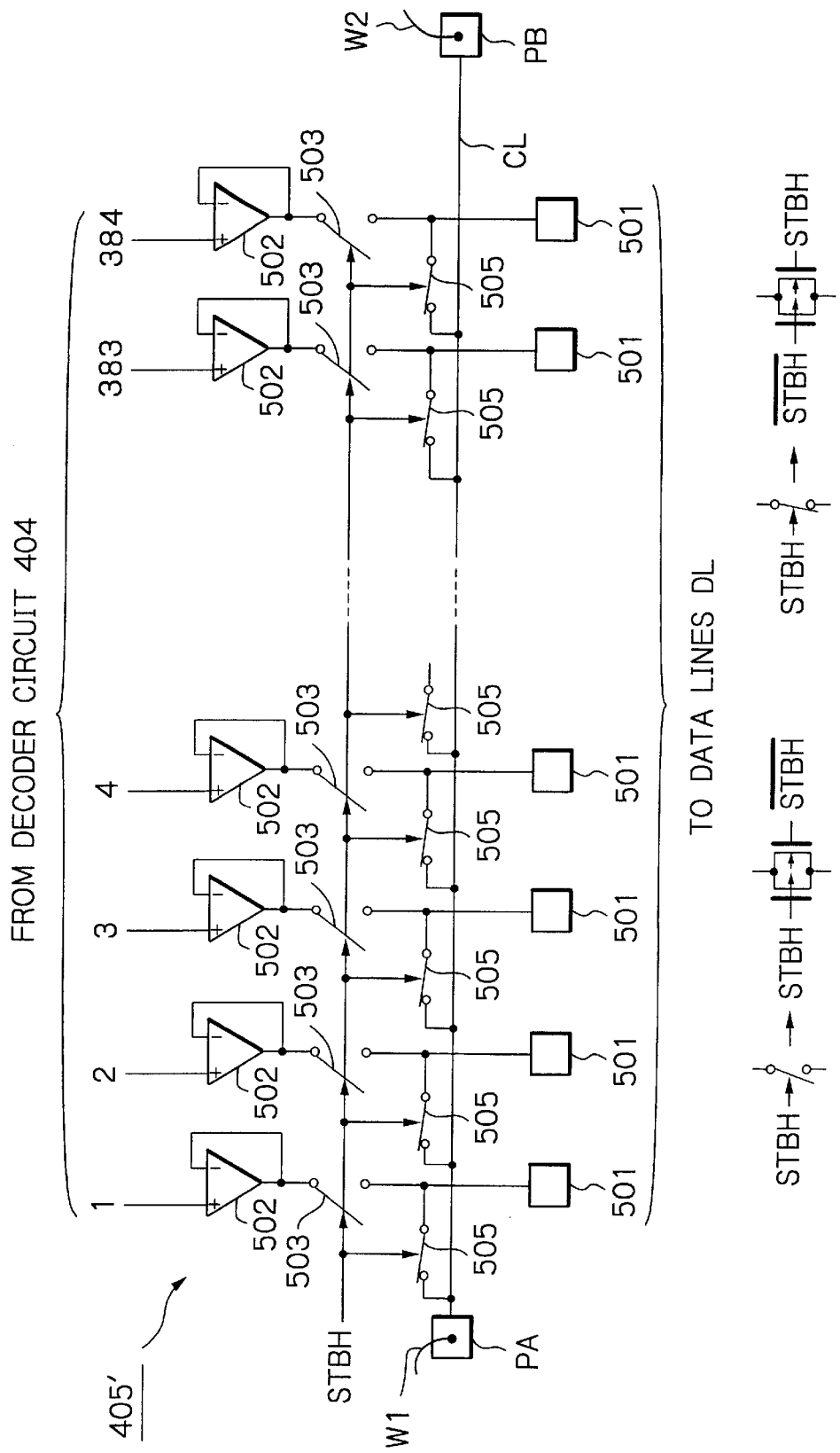
FIG. 12 is a detailed circuit diagram of a fourth example of the driver circuit of FIG. 7.

In FIG. 12, which is a detailed circuit diagram of a fourth example of the driver circuit 405' of FIG. 7, switches 505 formed by N-channel MOS transistors and a common line CL are provided instead of the switches 504, 504A and 504B of FIG. 8. The common line CL is connected between the charge neutralization pads PA and PB. Also, each of the switches 505 is connected between the common line CL and one of the output pads 501. The switches 505 are also controlled by the horizontal strobe signal STBH.

The operation of the driver circuit 405' of FIG. 12 is explained next with reference to FIG. 13.

First, the horizontal strobe signal STBH is made high, so that the switches 503 and 505 are turned OFF and ON, respectively. As a result, the operational amplifiers 502 are electrically isolated from the output pads 501 by the turned-OFF switches 503, Also, all the output pads 501 are electrically connected by the turned-ON switches 505 via the common line CL to each other. Additionally, the output pads of all the data line drive apparatuses 201' to 208' are electrically connected by the common line CL. Thus, the charges are neutralized among the data lines DL of all the data line drive apparatuses 201' to 208'. Then, the horizontal strobe signal STBH is made low, so that the switches 503 and 505 are turned ON and OFF, respectively. As a result, the operational amplifiers 502 are electrically connected to the output pads 501 by the turned-ON switches 503, and the output pads 501 are electrically isolated by the turned-OFF switches 504, 504A and 504B. Thus, the output signals of the operational amplifiers 502 are supplied to the data lines DL.

Even in the LCD module using the data line drive apparatuses 201' to 208' each including the driver circuit 405 of FIG. 12, since the neutralization of charges among the data lines DL is carried out between the data line drive apparatuses 201' to 208', no rib-like patterns are generated in the LCD panel 100.

As explained hereinabove, according to the present invention, rib-like patterns can be prevented from being generated in an LCD panel.

What is claimed is:

1. A liquid crystal display module comprising:
    a liquid crystal display panel having data lines, gate lines and liquid crystal cells each connected to one of said data lines and one of said gate lines; and
    a plurality of data line drive apparatuses, provided at an edge of said liquid crystal display panel and connected by a cascade connection to each other, for driving said data lines,
    each of said data line drive apparatuses comprising:
        a plurality of voltage followers;
        a plurality of output pads each connected to one of said data lines;
        a plurality of first switches each connected between one of said voltage followers and one of said output pads;
        a plurality of second switches each connected between two of said output pads;
        first and second charge neutralization pads, said second charge neutralization pad being connected to a most-downstream one of said output pads; and a third switch connected between said first charge neutralization pad and a most-upstream one of said output pads, said first, second and third switches being turned OFF, ON and ON, respectively, by a first state of a strobe signal, said first, second and third switches being turned ON, OFF and OFF, respectively, by a second state of said strobe signal, said first charge neutralization pad of one of said data line drive apparatuses being electrically connected to said second charge neutralization pad of another of said data line drive apparatuses upstream of said one of said data line drive apparatuses, said second charge neutralization pad of one of said data line drive apparatuses being electrically connected to said second charge neutralization pad of another of said data line drive apparatuses downstream of said one of said data line drive apparatuses.

2. The liquid crystal display module as set forth in claim 1, wherein each of said data line drive apparatuses further comprises a fourth switch connected between said second charge neutralization pad and the most-downstream one of said output pads, said fourth switch being turned ON and OFF by the first and second states, respectively, of said strobe signal.

3. The liquid crystal display module as set forth in claim 1, wherein said data line drive apparatuses carry out a dot inversion drive operation.

4. A liquid crystal display module comprising:
a liquid crystal display panel having data lines, gate lines and liquid crystal cells each connected to one of said data lines and one of said gate lines; and
a plurality of data line drive apparatuses, provided at an edge of said liquid crystal display panel and connected by a cascade connection to each other, for driving said data lines,
each of said data line drive apparatuses comprising:
a plurality of voltage followers;
a plurality of output pads each connected to one of said data lines;
a plurality of first switches each connected between one of said voltage followers and one of said output pads;
a plurality of second switches each connected between two of said output pads;
first and second charge neutralization pads, said first charge neutralization pad being connected to a most-upstream one of said output pads; and
a third switch connected between said second charge neutralization pad and a most-downstream one of said output pads,
said first, second and third switches being turned OFF, ON and ON, respectively, by a first state of a strobe signal,
said first, second and third switches being turned ON, OFF and OFF, respectively, by a second state of said strobe signal,
said first charge neutralization pad of one of said data line drive apparatuses being electrically connected to said second charge neutralization pad of another of said data line drive apparatuses upstream of said one of said data line drive apparatuses,
said second charge neutralization pad of one of said data line drive apparatuses being electrically connected to said second charge neutralization pad of another of said data line drive apparatuses downstream of said one of said data line drive apparatuses.

5. The liquid crystal display module as set forth in claim 4, wherein said data line drive apparatuses carry out a dot inversion drive operation.

6. A liquid crystal display module comprising:
a liquid crystal display panel having data lines, gate lines and liquid crystal cells each connected to one of said data lines and one of said gate lines; and
a plurality of data line drive apparatuses, provided at an edge of said liquid crystal display panel and connected by a cascade connection to each other, for driving said data lines,
each of said data line drive apparatuses comprising:
a plurality of voltage followers;
a plurality of output pads each connected to one of said data lines;
a plurality of first switches each connected between one of said voltage followers and one of said output pads;
first and second charge neutralization pad;
a common line connected between said first and second charge neutralization pads; and
a plurality of second switches each connected between said common line and one of said output pads,
said first and second switches being turned OFF and ON, respectively, by a first state of a strobe signal,
said first and second switches being turned ON and OFF, respectively, by a second state of said strobe signal,
said first charge neutralization pad of one of said data line drive apparatuses being electrically connected to said second charge neutralization pad of another of said data line drive apparatuses upstream of said one of said data line drive apparatuses,
said second charge neutralization pad of one of said data line drive apparatuses being electrically connected to said second charge neutralization pad of another of said data line drive apparatuses downstream of said one of said data line drive apparatuses.

7. The liquid crystal display module as set forth in claim 6, wherein said data line drive apparatuses carry out a dot inversion drive operation.

8. An apparatus for driving data lines of a liquid crystal display panel, comprising:
a plurality of voltage followers;
a plurality of output pads each connected to one of said data lines;
a plurality of first switches each connected between one of said voltage followers and one of said output pads;
a plurality of second switches each connected between two of said output pads;
first and second charge neutralization pads, said second charge neutralization pad being connected to a most-downstream one of said output pads; and
a third switch connected between said first charge neutralization pad and a most-upstream one of said output pads,
said first, second and third switches being turned OFF, ON and ON, respectively, by a first state of a strobe signal,
said first, second and third switches being turned ON, OFF and OFF, respectively, by a second state of said strobe signal.

9. The apparatus as set forth in claim 8, further comprising a fourth switch connected between said second charge neutralization pad and the most-downstream one of said output pads,
said fourth switch being turned ON and OFF by the first and second states, respectively, of said strobe signal.

10. An apparatus for driving data lines of a liquid crystal display panel, comprising:

a plurality of voltage followers;

a plurality of output pads each connected to one of said data lines;

a plurality of first switches each connected between one of said voltage followers and one of said output pads;

a plurality of second switches each connected between two of said output pads;

first and second charge neutralization pads, said first charge neutralization pad being connected to a most-downstream one of said output pads; and a third switch connected between said second charge neutralization pad and a most-upstream one of said output pads, said first, second and third switches being turned OFF, ON and ON, respectively, by a first state of a strobe signal, said first, second and third switches being turned ON, OFF and OFF, respectively, by a second state of said strobe signal.

11. An apparatus for driving data lines a liquid crystal display panel comprising:

a plurality of voltage followers;

a plurality of output pads each connected to one of said data lines;

a plurality of first switches each connected between one of said voltage followers and one of said output pads;

first and second charge neutralization pad;

a common line connected between said first and second charge neutralization pads; and a plurality of second switches each connected between said common line and one of said output pads, said first and second switches being turned OFF and ON, respectively, by a first state of a strobe signal, said first and second switches being turned ON and OFF, respectively, by a second state of said strobe signal.

\* \* \* \* \*